US012621936B2

(12) United States Patent
Galati et al.

(10) Patent No.: US 12,621,936 B2
(45) Date of Patent: May 5, 2026

(54) CONDUCTIVE TRACES

(71) Applicant: PERIDOT PRINT LLC, Palo Alto, CA (US)

(72) Inventors: Elizabeth Ann Galati, Palo Alto, CA (US); John Samuel Dilip Jangam, Palo Alto, CA (US); Thomas Craig Anthony, Palo Alto, CA (US); Aja Pariante Hartman, Palo Alto, CA (US); Kristopher J. Erickson, Palo Alto, CA (US)

(73) Assignee: Peridot Print LLC, Palo Alto, CA (US)

( * ) Notice: Subject to any disclaimer, the term of this patent is extended or adjusted under 35 U.S.C. 154(b) by 44 days.

(21) Appl. No.: 18/039,379

(22) PCT Filed: Dec. 1, 2020

(86) PCT No.: PCT/US2020/070835
§ 371 (c)(1),
(2) Date: May 30, 2023

(87) PCT Pub. No.: WO2022/119584
PCT Pub. Date: Jun. 9, 2022

(65) Prior Publication Data
US 2024/0008187 A1 Jan. 4, 2024

(51) Int. Cl.
*H05K 3/10* (2006.01)
*H05K 1/09* (2006.01)
(52) U.S. Cl.
CPC ............. *H05K 3/105* (2013.01); *H05K 1/097* (2013.01); *H05K 2203/0783* (2013.01); *H05K 2203/125* (2013.01)

(58) Field of Classification Search
CPC ......................... H05K 3/105; H05K 2203/125
See application file for complete search history.

(56) References Cited

U.S. PATENT DOCUMENTS

| | | | | | |
|---|---|---|---|---|---|
| 5,679,724 | A | * | 10/1997 | Sacripante | C08J 3/215 |
| | | | | | 347/100 |
| 2006/0001726 | A1 | * | 1/2006 | Kodas | C23C 18/08 |
| | | | | | 347/105 |
| 2006/0093732 | A1 | * | 5/2006 | Schut | C23C 18/2086 |
| | | | | | 427/58 |
| 2010/0166952 | A1 | | 7/2010 | Chiou et al. | |
| 2020/0031040 | A1 | * | 1/2020 | Goredema | H05K 3/287 |

FOREIGN PATENT DOCUMENTS

| | | | | |
|---|---|---|---|---|
| EP | 3606297 A1 | 2/2020 | | |
| WO | 03/32084 A2 | 4/2003 | | |
| WO | WO-03032084 A2 | * 4/2003 | ............. | B01J 21/18 |
| WO | 2015/181822 A1 | 12/2015 | | |
| WO | 2019/025970 A1 | 2/2019 | | |
| WO | 2019/031706 A1 | 2/2019 | | |
| WO | 2019/068770 A1 | 4/2019 | | |

* cited by examiner

*Primary Examiner* — Robert A Vetere
(74) *Attorney, Agent, or Firm* — Dierker & Kavanaugh, P.C.

(57) ABSTRACT

The present disclosure relates to a conductive trace precursor composition comprising a metal salt; 3 to 15 weight % of a reducing solvent selected from a lactam and/or a polyol, and water. Where the reducing solvent is 2-pyrrolidinone, the 2-pyrrolidinone is not present in an amount of 5 weight % or in an amount of 7.5 weight % of the conductive trace precursor composition.

10 Claims, 1 Drawing Sheet

CONDUCTIVE TRACES

BACKGROUND

When manufacturing printed electronics, conductive traces may be printed onto substrates using conductive ink compositions. A conductive ink composition may comprise metal nanoparticles, such as copper nanoparticles, dispersed in a liquid carrier. Once printed, the nanoparticles are deposited on the substrate and these may be sintered at high temperature and pressure to form the conductive trace.

Three-dimensional (3D) printing is an additive printing process used to make three-dimensional objects from a digital model. Some 3D printing techniques may be considered additive processes because they involve the application of successive layers of material

BRIEF DESCRIPTION OF THE DRAWING

Features of examples of the present disclosure will become apparent by reference to the following detailed description and drawings.

DETAILED DESCRIPTION

Figure 1:
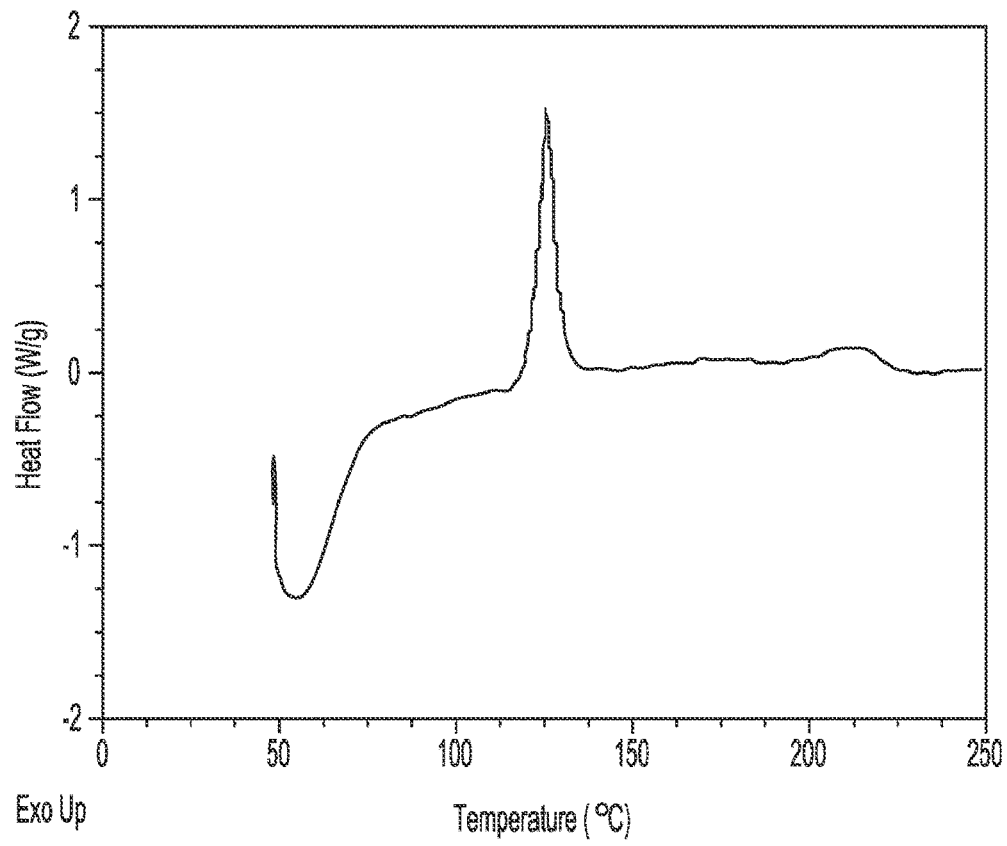
FIG. 1 shows the exotherm detected with compositions I and II by differential scanning calorimetry (DSC) in Example 1.

The present disclosure relates to a method of 3D printing a 3D printed object having a conductive trace. The method comprises selectively applying a fusing agent and a conductive trace precursor composition to a powder bed material. The fusing agent comprises a radiation absorber and a liquid carrier, and the conductive trace precursor composition comprises a metal salt and a liquid carrier. The method comprises reducing the metal salt; and irradiating the selectively applied fusing agent to generate thermal energy to coalesce the powder bed material to form a layer of the 3D printed object.

The present disclosure also relates to a 3D printed object having a conductive trace. The object is obtainable by the method above.

In the present disclosure, a conductive trace precursor composition comprising a metal salt is selectively applied to powder bed material during the 3D printing process. A fusing agent comprising a radiation absorber may also be applied to the powder bed material. When the applied fusing agent is irradiated with electromagnetic energy, thermal energy is generated to coalesce the powder bed material to form a layer of the 3D printed object. The heat generated can also facilitate the reduction of the metal salt to metal, leading to the formation of the conductive trace during the course of 3D printing. This can allow conductive traces to be printed within the internal structure of the 3D printed object, and reduce or eliminate the requirement for post-printing treatments to reduce or sinter the metal.

It may be possible to reduce the metal salt by applying a reducing agent to the applied conductive trace precursor composition. Alternatively, it may be possible to include a reducing agent in the conductive trace precursor composition. Suitable reducing agents include polyols and lactams. Such compounds can react with the metal salt at elevated temperatures. Accordingly, once printed, conductive trace composition may be heated to facilitate the reduction of the metal salt by the reducing agent.

The present disclosure relates to a conductive trace precursor composition comprising a metal salt; 3 to 15 weight % of a reducing solvent selected from a lactam and/or a polyol, and water. Where the reducing solvent is 2-pyrrolidinone, the 2-pyrrolidinone is not present in an amount of 5 weight % or in an amount of 7.5 weight % of the conductive trace precursor composition.

The present disclosure also relates to a method of printing a conductive trace onto a substrate. The method comprises applying a conductive trace precursor composition to a print substrate. The conductive trace precursor composition comprises a metal salt, water and 3 to 15 weight % of a reducing solvent selected from a lactam and/or a polyol. The method also comprises heating the conductive trace precursor to reduce the metal salt to metal.

In some examples, the metal salt may be a transition metal salt, for instance, a copper salt. Any suitable metal salt may be employed. For example, the salt may be an inorganic or organic salt. The salt may comprise at least one anion selected from the group consisting of hydroxide, carbonate, sulfate, nitrate, acetate, formate, borate, chloride, bromide, and combinations thereof. In one example, the salt is copper nitrate. The salt may be a hydrated metal salt. For example, the salt may be hydrated copper nitrate.

The reducing solvent may also act as a humectant. Where the reducing solvent is a lactam, examples of suitable lactams include lactams and polylactams, for instance, 2-pyrrolidinone, 1-(2-hydroxyethyl)-2-pyrrolidone and polyvinylpyrrolidone. Where the reducing solvent is a polyol, examples of suitable polyols include diols and triols. Examples include ethylene glycol, propylene glycol, glycerol, glycerol ethoxylate, ethylhydroxypropanediol, 1,2-butanediol, diethylene glycol and dipropylene glycol. In some examples, the reducing solvent may be 2-pyrrolidinone.

The reducing solvent may be selected from at least one of ethylene glycol, propylene glycol, glycerol, glycerol ethoxylate, ethylhydroxypropanediol, 1,2-butanediol, diethylene glycol, dipropylene glycol, 2-pyrrolidinone, 1-(2-hydroxyethyl)-2-pyrrolidinone and polyvinylpyrrolidone. In some examples, the reducing agent may be 2-pyrrolidinone.

Where employed, the reducing solvent may be present in an amount of 4 to 15 weight %, for example, 5 to 12 weight % or 6 to 10 weight % of the conductive trace precursor composition.

In some examples, reduction of the metal salt may be initiated by heating to a temperature of 100 to 300° C. In some examples, the temperature may be at least 120° C., for example, 125 to 140° C. Heating may facilitate drying of the printed conductive trace precursor composition, for example, by driving the evaporation of water from the printed composition. Heating may also facilitate reduction of the metal salt.

In examples where a reducing solvent is employed, the reducing solvent may have a boiling point higher than, for example, about 180 degrees C. By selecting a reducing solvent with an appropriate boiling point, some reducing solvent may remain even after the printed conductive trace precursor composition is dried. In some examples, this reducing solvent may act as a barrier that reduces the rate or risk of the reduced metal re-oxidizing under the print conditions.

Heating may be accomplished by heating the powder bed material. This heating may be carried out by e.g. heating the print platform or using heating lamps positioned above the print platform. In the 3D printing process, heating may be carried out using the fusing agent.

In some examples where a conductive trace is formed on a print substrate, suitable substrates may include classes of materials, such as paper (sheets or rolls), polymeric substrates (sheets, fabrics, rolls, panels or films), glass (rolls, sheets, or panels), or semi-conductor materials. Examples of paper include high ceramic loading paper products. The paper products may be treated to help activate sintering, for instance, performed post-printing. Examples polymeric materials include: nylon, polyimide, PET, PBT, PP, and TPU. Glass materials include borosilicate glasses or other, including flexible glasses. Semi-conductor materials include silicon wafers (single-crystalline, poly-crystalline or amorphous). In some examples, the print substrates can undergo a post-print process sinter step, which can be a high temperature process using an oven, furnace, flash-lamp or other heating method.

Conductive Trace Precursor Composition

As mentioned above, the conductive trace precursor composition comprises a metal salt. The metal salt may be an organic or inorganic metal salt. The metal salt may comprise a metal selected from the group consisting of aluminum, magnesium, copper, zinc, iron, nickel, manganese, cobalt, molybdenum, chromium, tin, vanadium, and combinations thereof. The metal salt may comprise an anion selected from the group consisting of hydroxide, carbonate, sulfate, nitrate, acetate, formate, borate, chloride, bromide, and combinations thereof.

In some examples, the metal salt may be a copper salt. The copper salt may be an inorganic or organic metal salt.

In some examples, the copper salt may be a hydroxide, a carbonate, a sulfate, a nitrate, an acetate, a formate, a borate, a chloride and/or a bromide. In one example, the copper salt is copper nitrate.

In some examples, the metal salt may be a hydrated metal salt. The hydrated metal salt may be selected from the group consisting of hydrated copper nitrate, hydrated iron nitrate, hydrated nickel nitrate, hydrated manganese nitrate, hydrated cobalt nitrate, hydrated iron acetate, and combinations thereof.

In some examples, the hydrated metal salt may be hydrated copper nitrate. For instance, the hydrated metal salt may be hydrated copper (II) nitrate. In some examples, the hydrated metal salt may be copper (II) nitrate trihydrate.

Where a hydrated metal salt is used, the hydrated metal salt may have a dehydration temperature of from 100 to about 250° C. In some examples, dehydration temperature as used in this disclosure may be the temperature by which all, or nearly all, of the water molecules in the hydrated metal salt have either been removed by evaporation or reacted to form other compounds. Dehydration may be progressive. Dehydration may occur in multiple discrete steps as the hydrated metal salt is heated.

In some examples where a hydrated metal salt is used, the dehydration temperature may be more than about 100° C., or more than about 110° C., or more than about 120° C., or more than about 130° C., or more than about 140° C., or more than about 150° C., or more than about 160° C., or more than about 170° C., or more than about 180° C., or more than about 190° C., or more than about 200° C., or more than about 210° C., or more than about 220° C., or more than about 230° C., or more than about 240° C., or less than about 250° C., or less than about 240° C.

In some examples where a hydrated metal salt is used, the dehydration temperature may be less than about 230° C., or less than about 220° C., or less than about 210° C., or less than about 200° C., or less than about 190° C., or less than about 180° C., less than about 170° C., or less than about 160° C., or less than about 150° C., or less than about 140° C., or less than about 130° C., or less than about 120° C., or less than about 110° C.

In some examples where a hydrated metal salt is used, the dehydration temperature may be from about 100° C. to about 240° C., or from about 100° C. to about 230° C., or from about 100° C. to about 220° C., or from about 100° C. to about 210° C., or from about 100° C. to about 200° C., or from about 100° C. to about 190° C., or from about 100° C. to about 180° C., or from about 100° C. to about 170° C., or from about 100° C. to about 160° C., or from about 100° C. to about 150° C., or from about 100° C. to about 140° C., or from about 100° C. to about 130° C., or from about 100° C. to about 120° C., or from about 100° C. to about 110° C.

In some examples, the metal salt may be present in the conductive trace precursor composition at about 10 weight % to up to 100 weight % of the saturation concentration of the metal salt in water at 25 degrees C. For example, the metal salt may be present in the conductive trace precursor composition at about 30 weight % to up to 99 weight % of the saturation concentration, for example, at about 25 weight % up to 95 weight % of the saturation concentration.

In some examples, the metal salt may be present in an amount of at least about 5 weight % of the total weight of the conductive trace precursor composition, for example, at least about 10 weight %, at least about 15 weight %, at least about 20 weight %, at least about 25 weight %, at least about 30 weight %, at least about 35 weight % or at least about 40 weight %.

In some examples, the metal salt may be present in an amount of at most about 70 weight % of the total weight of the conductive trace precursor composition, for example, at most about 65 weight % or at most about 60 weight %.

In some examples, the metal salt may be present in an amount of from about 5 wt % to about 70 wt % based on the total weight of the conductive trace precursor composition, or from about 10 wt % to about 65 wt % based on the total weight of the conductive trace precursor composition, or from about 15 wt % to about 60 wt % based on the total weight of the conductive trace precursor composition, or from about 20 wt % to about 55 wt % based on the total weight of the conductive trace precursor composition, or from about 25 wt % to about 55 wt % based on the total weight of the conductive trace precursor composition, or from about 30 wt % to about 50 wt % based on the total weight of the conductive trace precursor composition, or from about 35 wt % to about 50 wt % based on the total weight of the conductive trace precursor composition, or from about 40 wt % to about 50 wt % based on the total weight of the conductive trace precursor composition.

In some examples, the metal salt may be copper nitrate (e.g. hydrated copper (II) nitrate or copper (II) nitrate trihydrate). The amount of copper nitrate in the conductive trace precursor composition may be at least about 30 weight %, for example, at least about 35 weight %. The amount of hydrated copper nitrate in the conductive trace precursor composition may be at most about 58 weight %, for example, at most about 56 weight %. In some examples, the amount of hydrated copper nitrate may be from about 35 to about 58 weight %, for instance, from about 38 to about 58 weight %.

As mentioned above, the conductive trace precursor composition also comprises water. Water may be the liquid vehicle of the conductive trace precursor composition. Water may be present in an amount of at least about 40 weight %, for example, at least about 42 weight %, at least about 45 weight %, at least about 50 weight % or at least about 55 weight %.

In some examples, water may be present in an amount of about 40 to about 70 weight %, for instance, about 42 to about 67 weight %, about 45 to about 65 weight %, about 50 to about 65 weight % or about 55 to about 60 weight %.

The conductive trace precursor composition may comprise a reducing solvent. Where a reducing solvent is used, the reducing solvent is present in an amount of at least about 3 weight % of the conductive trace precursor composition.

In some examples, the reducing solvent may be present in an amount of at most about 20 weight % of the conductive trace precursor composition. In some examples, the reducing agent may be present in an amount of at most about 18 weight % or at least about 15 weight % of the conductive trace precursor composition.

In some examples, the reducing solvent may be present in an amount of about 3 to about 20 weight %, for instance, about 4 to about 18 weight % of the conductive trace precursor composition. In some examples, the reducing solvent may be present in an amount of about 5 to about 16 weight %, for instance, about 6 to about 14 weight % or about 7 to about 12 weight % of the conductive trace precursor composition.

In some examples, the reducing solvent may be present in an amount of about 3 to about 15 weight %, for instance, about 4 to about 12 weight % of the conductive trace precursor composition.

The reducing solvent may be a lactam and/or a polyol. Examples of suitable lactams include lactams and polylactams, for instance, 2-pyrrolidinone, 1-(2-hydroxyethyl)-2-pyrrolidone and polyvinylpyrrolidone. Examples of suitable polyols include diols and triols. Examples include ethylene glycol, propylene glycol, glycerol, glycerol ethoxylate, ethylhydroxypropanediol, 1,2-butanediol, diethylene glycol and dipropylene glycol.

While it may be possible to include the reducing solvent in the conductive trace precursor composition, it may be possible, for example, in the 3D printing method, to apply the reducing solvent separately (e.g. by inkjet printing).

In some examples, the reducing solvent may be 2-pyrrolidinone. In some examples where the reducing solvent is 2-pyrrolidinone, the amount of 2-pyrrolidinone may be 5 weight % or 7.5 weight % of the conductive trace precursor composition. In other examples where the reducing solvent is 2-pyrrolidinone, the amount of 2-pyrrolidinone is not 5 weight % and not 7.5 weight % of the conductive trace precursor composition.

Where present, the reducing solvent may have a boiling point of at least about 135 degrees C., for instance, at least about 140 degrees C. The reducing solvent may have a boiling point of at most about 400 degrees C., for example, at most about 380 degrees C. In some examples, the reducing solvent may have a boiling point of about 135 to about 400 degrees C., for instance, 140 to 380 degrees C. The reducing solvent may be a lactam having a boiling point in the range of about 140 to about 260 degrees C., for instance, about 200 to about 250 degrees C. The reducing solvent may be a polyol having a boiling point in the range of about 170 to about 400 degrees C., for instance, about 180 to about 380 degrees C. or about 200 to about 300 degrees C. In some examples, the reducing solvent may be a polyol having a boiling point of about 225 to about 250 degrees C.

In some examples, the conductive trace precursor composition may comprise surfactant. Where present, suitable surfactants include non-ionic surfactants. Examples of suitable surfactants include surfactants based on acetylenic diol chemistry (e.g., SURFYNOL® SEF from Air Products and Chemicals, Inc.), fluorosurfactants (e.g., CAPSTONE® fluorosurfactants from DuPont, previously known as ZONYL FSO), and combinations thereof. In other examples, the surfactant may be an ethoxylated low-foam wetting agent (e.g., SURFYNOL® 440 or SURFYNOL® CT-111 from Air Products and Chemical Inc.) or an ethoxylated wetting agent and molecular defoamer (e.g., SURFYNOL® 420 from Air Products and Chemical Inc.). Still other suitable surfactants include non-ionic wetting agents and molecular defoamers (e.g., SURFYNOL® 104E from Air Products and Chemical Inc.) or water-soluble, non-ionic surfactants (e.g., TERGITOL™ TMN-6 or TERGITOL™ 15-S-7 from The Dow Chemical Company). In other examples, the surfactant may be a sulfonated surfactant, for example, a disulfonated surfactant, such as an alkyldiphenyloxide disulfonate (e.g. DOWFAX™ 2A1). In some examples, it may be useful to utilize a surfactant having a hydrophilic-lipophilic balance (HLB) less than 10.

When a surfactant is used, the total amount of surfactant(s) in the conductive trace precursor composition may range from about 0 to about 3 weight % based on the total weight of the conductive trace precursor composition. The total amount of surfactant(s) in the conductive trace precursor composition may be less than about 3 weight %, for example, less than about 2 weight %, less than about 1 weight %, less than about 0.5 weight %, less than about 0.2 weight % or less than 0.1 weight % based on the total weight of the conductive trace precursor composition.

Other components may also be present in the conductive trace precursor composition. Examples include antimicrobial agent(s), anti-kogation agent(s), viscosity modifier(s), pH adjuster(s) and/or sequestering agent(s).

Suitable antimicrobial agents include biocides and fungicides. Example antimicrobial agents may include the NUOSEPT™ (Troy Corp.), UCARCIDE™ (Dow Chemical Co.), ACTICIDE® M20 (Thor), and combinations thereof. Examples of suitable biocides include an aqueous solution of 1,2-benzisothiazolin-3-one (e.g., PROXEL® GXL from Arch Chemicals, Inc.), quaternary ammonium compounds (e.g., Bardac® 2250 and 2280, Barquat® 50-65B, and Carboquat® 250-T, all from Lonza Ltd. Corp.), and an aqueous solution of methylisothiazolone (e.g., Kordek® MLX from Dow Chemical Co.). The biocide or antimicrobial may be added in any amount ranging from about 0.05 wt % to about 0.5 wt % (as indicated by regulatory usage levels) with respect to the total weight of the conductive trace precursor composition.

In some examples, the biocide and/or antimicrobial component may be present in an amount of less than 0.1 weight %, for example, less than about 0.08 weight %, or less than 0.005 weight %.

As mentioned above, an anti-kogation agent may be included in the conductive trace precursor composition. Kogation refers to the deposit of dried ink (e.g. conductive trace precursor composition) on a heating element of a thermal inkjet printhead. Anti-kogation agent(s) is/are included to assist in preventing the buildup of kogation. Examples of suitable anti-kogation agents include oleth-3-phosphate (e.g., commercially available as CRODAFOS™ O3A or CRODAFOS™ N-3 acid from Croda), or a combination of oleth-3-phosphate and a low molecular weight (e.g., <5,000) polyacrylic acid polymer (e.g., commercially available as CARBOSPERSE™ K-7028 Polyacrylate from Lubrizol). Whether a single anti-kogation agent is used or a combination of anti-kogation agents is used, the total amount of anti-kogation agent(s) in the conductive trace precursor composition may range from greater than 0.2 wt % to about 0.8 wt % based on the total weight of the conductive trace precursor composition. In an example, the oleth-3-phosphate is included in an amount ranging from about 0.2 wt % to about 0.6 wt %, and the low molecular weight polyacrylic acid polymer is included in an amount ranging from about 0.005 wt % to about 0.03 wt %.

Sequestering agents, such as EDTA (ethylene diamine tetra acetic acid), may be included to eliminate the deleterious effects of heavy metal impurities, and buffer solutions may be used to control the pH of the conductive trace precursor composition. In some examples, the sequestering agent may be present in an amount of less than 2 weight %, for example, less than about 0.2 weight %, or less than 0.1 weight %.

In some examples, reduction of the metal salt may be initiated by heating the printed conductive trace precursor composition to a temperature of 100 to 300° C. In some examples, the temperature may be at least 120° C., for example, 125 to 140° C.

By heating the printed conductive trace precursor composition, any water in the printed conductive trace precursor composition may evaporate. Heating may also facilitate reduction of the metal salt of the conductive trace precursor composition.

Heating may be accomplished by e.g. heating the print platform or varying the temperature of the printer. The latter may be accomplished through the use of heating lamps positioned over the print platform. To provide resolution to the printed conductive trace precursor composition, it may be possible to selectively cool portions of the printed conductive trace precursor composition, for example, by selectively applying a detailing agent (see below) to portions of the printed conductive trace precursor composition to avoid or lessen the extent of reduction of the metal salt in these areas. To provide resolution to the 3D printed layer, it may be possible to selectively cool portions of the powder bed material, for example, by selectively applying a detailing agent (see below) to portions of the powder bed material to avoid or lessen the extent of fusing.

In some examples, heating may be carried out by using a fusing agent. The fusing agent may be a composition comprising a radiation absorber and a liquid carrier. In some examples, the method further comprises applying a fusing over or adjacent to at least one of the layers of printed conductive trace precursor composition. The fusing agent comprises a radiation absorber and a liquid carrier. When the applied fusing agent is irradiated with electromagnetic radiation, the radiation absorber generates heat for the reduction of metal salt and/or for coalescing powder bed material.

Fusing Agent

In e.g. the 3D printing method of the present disclosure, the method may comprise selectively applying a fusing agent to the powder bed material and exposing at least part of the fusing agent to radiation.

The fusing agent can include a radiation absorber. The radiation absorber or pigment can absorb electromagnetic radiation and convert that radiation into heat. The fusing agent can be selectively applied to or adjacent to the areas of the printed conductive trace precursor composition that are intended to be reduced.

The fusing agent can be applied, for example, by printing with a fluid or inkjet printhead. Accordingly, the fusing agent can be applied with precision to selected areas to form a layer of the 3D printed object. After applying the fusing agent, the powder bed can be irradiated with radiant energy.

The radiation absorber can absorb this energy and convert it to heat, thereby heating any of powder bed material in contact or adjacent to the radiation absorber of the fusing agent. An appropriate amount of radiant energy can be applied so that enough heat is generated to cause the metal salt in the conductive trace precursor composition to be reduced. This can facilitate the formation of the conductive trace.

The radiation absorber of the fusing agent may be any suitable absorber. Examples of suitable absorbers include UV absorbers, infrared absorbers and near infrared absorbers. In some examples, infrared absorbers or near infrared absorbers are employed. In some examples, the infrared absorber or near infrared absorber may absorb electromagnetic radiation in the range of 700 nm to 1 mm. In many cases, the infrared absorber or near infrared absorber can have a peak absorption wavelength in the range of 800 nm to 1400 nm.

In some examples, the absorber can be carbon black, tungsten bronze, molybdenum bronze, conjugated polymer, aminium dye, tetraaryldiamine dye, cyanine dye, phthalocyanine dye, dithiolene dye, metal phosphate, metal silicate or mixtures thereof.

The absorber may be a near infrared absorbing dye. Examples of absorbing dyes include aminium dyes, tetraaryldiamine dyes, cyanine dyes, pthalocyanine dyes, dithiolene dyes, and others.

In further examples, the absorber can be a near-infrared absorbing conjugated polymer such as poly(3,4-ethylenedioxythiophene)-poly(styrenesulfonate) (PEDOT:PSS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds.

Other examples of radiation absorbers or pigments can include phosphates having a variety of counterions such as copper, zinc, iron, magnesium, calcium, strontium, the like, and combinations thereof. Specific examples of phosphates can include $M_2P_2O_7$, $M_4P_2O_9$, $M_5P_2O_{10}$, $M_3(PO_4)_2$, $M(PO_3)_2$, $M_2P_4O_{12}$, and combinations thereof, where M represents a counterion having an oxidation state of +2, such as those listed above or a combination thereof. For example, $M_2P_2O_7$ can include compounds such as $Cu_2P_2O_7$, $Cu/MgP_2O_7$, $Cu/ZnP_2O_7$, or any other suitable combination of counterions. It is noted that the phosphates described herein are not limited to counterions having a +2 oxidation state. Other phosphate counterions can also be used to prepare other suitable radiation absorbers.

Other examples of radiation absorbers or pigments include silicates. The silicates can have the same or similar counterions as the phosphates. One non-limiting example can include $M_2SiO_4$, $M_2Si_2O_6$, and other silicates where M is a counterion having an oxidation state of +2. For example, the silicate $M_2Si_2O_6$ can include $Mg_2Si_2O_6$, $Mg/CaSi_2O_6$, $MgCuSi_2O_6$, $Cu_2Si_2O_6$, $Cu/ZnSi_2O_6$, or other suitable combination of counterions. It is noted that the silicates described herein are not limited to counterions having a +2 oxidation state. Other silicate counterions can also be used to prepare other suitable pigments.

In some examples, a radiation absorber having low electrical conductivity may be used to reduce the risk of interference with the conductive trace. Examples of these can also include: carbon black, carbon nanotubes, graphene, poly(3,4-ethylenedioxythiophene) polystyrene sulfonate (PEDOT:PSS), tin-doped indium oxide (ITO) nanoparticles, silicon nanoparticles, and combinations thereof.

In some examples, the radiation absorber may be dissolved or dispersed in a liquid vehicle. The fusing agent may be a liquid composition comprising the radiation absorber, e.g. UV absorber, near infrared absorber or infrared absorber and a liquid carrier.

The liquid carrier can include water. In some examples, an additional co-solvent may also be present. In certain examples, a high boiling point co-solvent can be included in the fusing agent. The high boiling point co-solvent can be an organic co-solvent that boils at a temperature higher than the temperature of the bed of powder bed material during printing. In some examples, the high boiling point co-solvent can have a boiling point above 250° C. In still further examples, the high boiling point co-solvent can be present at a concentration of at least about 1 wt %, for example, at least about 1.5 wt % of the total weight of the fusing agent. The co-solvent, where employed may be present in an amount of at most about 50 wt %, for example, at most about 40 wt %, at most about 35 wt % or at most about 30 wt %. In some examples, the co-solvent may be present in an amount of from about 1 wt % to about 40 wt % of the total weight of the fusing agent.

Classes of co-solvents that can be used can include organic co-solvents including aliphatic alcohols, aromatic alcohols, diols, glycol ethers, polyglycol ethers, caprolactams, formamides, acetamides, and long chain alcohols. Examples of such compounds include primary aliphatic alcohols, secondary aliphatic alcohols, 1,2-alcohols, 1,3-alcohols, 1,5-alcohols, ethylene glycol alkyl ethers, propylene glycol alkyl ethers, higher homologs ($C_6$-$C_{12}$) of polyethylene glycol alkyl ethers, N-alkyl caprolactams, unsubstituted caprolactams, both substituted and unsubstituted formamides, both substituted and unsubstituted acetamides, and the like. Specific examples of solvents that can be used include 2-pyrrolidinone, N-methylpyrrolidone, 2-hydroxyethyl-2-pyrrolidone, 2-methyl-1,3-propanediol, tetraethylene glycol, 1,6-hexanediol, 1,5-hexanediol and 1,5-pentanediol.

A surfactant, or combination of surfactants, can also be present in the fusing agent. Examples of surfactants include alkyl polyethylene oxides, alkyl phenyl polyethylene oxides, polyethylene oxide block copolymers, acetylenic polyethylene oxides, polyethylene oxide (di)esters, polyethylene oxide amines, protonated polyethylene oxide amines, protonated polyethylene oxide amides, dimethicone copolyols, substituted amine oxides, and the like. Other surfactants can include liponic esters such as Tergitol™ 15-S-12, Tergitol™ 15-S-7 available from Dow Chemical Company, LEG-1 and LEG-7; Triton™ X-100; Triton™ X-405 available from Dow Chemical Company; and sodium dodecylsulfate.

The amount of surfactant present in the fusing agent may range from about 0.01 wt % to about 20 wt %.

Various other additives can be employed to optimize the properties of the fusing agent for specific applications. Such additives can be present at from about 0.01 wt % to about 20 wt % of the fusing agent. Examples of these additives are those added to inhibit the growth of harmful microorganisms. These additives may be biocides, fungicides, and other microbial agents, which can be used in ink jet formulations. Examples of suitable microbial agents include NUOSEPT® (Nudex, Inc.), UCARCIDE™ (Union carbide Corp.), VAN-CIDE® (R.T. Vanderbilt Co.), PROXEL® (ICI America), and combinations thereof.

Sequestering agents, such as EDTA (ethylene diamine tetra acetic acid), may be included to eliminate the delerious effects of heavy metal impurities. Buffers may also be used to control the pH of the composition. Viscosity modifiers may also be present.

The amount of radiation absorber, e.g. UV absorber, infrared absorber or near infrared absorber, in the fusing agent can vary depending on the type of absorber. In some examples, the concentration of infrared absorber or near infrared absorber in the fusing agent can be from about 0.1 wt % to about 20 wt % of the fusing agent. In one example, the concentration of absorber in the heating ink can be from about 0.1 wt % to about 15 wt %. In another example, the concentration can be from about 0.1 wt % to about 8 wt %. In yet another example, the concentration can be from about 0.5 wt % to about 2 wt %. In a particular example, the concentration can be from about 0.5 wt % to about 1.2 wt %.

The fusing agent may be selectively applied over a portion of at least one of the layers. The fusing agent may facilitate heating and reduction of the metal salt in specific areas of the printed conductive trace precursor composition. In some examples, a detailing agent may be employed, for instance, in combination with the fusing agent to selectively provide specific areas of the build material with the resolution required to selectively effect reduction of the metal salt at particular regions of the printed conductive trace precursor composition. In some examples, fusing agent and detailing agent may also be used in combination to provide resolution and/or detail to the fusing of the powder bed material.

Detailing Agents

Where a detailing agent is used, the detailing agent can be capable of reducing the temperature of the printed build material. The detailing agent can increase selectivity between regions of printed build material where the metal salt is reduced and regions of printed build material where no reduction occurs. Detailing agent may also be used to provide resolution to fused and non-fused portions of the powder bed material.

In some examples, the detailing agent can be a solvent that evaporates when it comes into contact with the printed build material at the print platform preheat temperature, thereby cooling selective portions of the printed build material through evaporative cooling. In certain examples, the detailing agent can include water, co-solvents, or combinations thereof.

Non-limiting examples of co-solvents for use in the detailing agent can include xylene, methyl isobutyl ketone, 3-methoxy-3-methyl-1-butyl acetate, ethyl acetate, butyl acetate, propylene glycol monomethyl ether, ethylene glycol mono tert-butyl ether, dipropylene glycol methyl ether, diethylene glycol butyl ether, ethylene glycol monobutyl ether, 3-Methoxy-3-Methyl-1-butanol, isobutyl alcohol, 1,4-butanediol, N,N-dimethyl acetamide, and combinations thereof.

In some examples, the detailing agent can be mostly water. In a particular example, the detailing agent can be about 85 wt % water or more. In further examples, the detailing agent can be about 95 wt % water or more. In still further examples, the detailing agent can be substantially devoid of radiation absorbers.

The detailing agent can also include ingredients to allow the detailing agent to be jetted by a fluid jet printhead. In some examples, the detailing agent can include additives such as those in the fusing agent described above. These ingredients can include a liquid vehicle, surfactant, dispersant, co-solvent, biocides, viscosity modifiers, materials for pH adjustment, sequestering agents, preservatives, and so on. These ingredients can be included in any of the amounts described above.

Powder Bed Material

The powder bed material is in the form of particles or powder.

The particles may have an average particle size of at least about 10 µm, for example, at least about 15 µm, at least about 20 µm, at least about 30 µm, at least about 40 µm or at least about 50 µm. The particles may have an average particle size of at most about 120 about, for example, at most about 110 µm, at most about 100 µm, at most about 90 µm, at most about 80 µm or at most about 75 µm.

In some examples, the powder bed material may have an average particle size of from about 10 to about 120 µm, for example, about 15 to about 110 µm. In some examples, the powder bed material may have an average particle size of from about 20 to about 100 µm, about 30 to about 90 µm, about 40 to about 80 µm or about 50 to about 75 µm. As used in the present disclosure, "average" with respect to properties of particles refers to a volume average unless otherwise specified. Accordingly, "average particle size" refers to a volume average particle size. Additionally, "particle size" refers to the diameter of spherical particles, or to the longest dimension of non-spherical particles. Particle size may be determined by any suitable method, for example, by laser diffraction spectroscopy.

In accordance with some examples, the volume-based particle size distribution of the powder bed material can be as follows: D50 can be from about 45 µm to about 75 µm, from about 55 µm to about 65 µm, or about 60 µm; D10 can be from about 20 µm to about 50 µm, from about 30 µm to about 40 µm, or about 35 µm; and D90 can be from about 75 µm to about 100 µm, from about 80 µm to about 95 µm, or about 90 µm. "D50" is defined as the median particle diameter (by volume). "D10" is defined as the tenth-percentile by volume of powder that is below a given particle size, e.g., from about 20 µm to about 50 µm. "D90" is defined as the ninetieth-percentile by volume of powder that is below a given particle size, e.g., about 75 µm to about 100 µm.

In one example, the particle size distribution of the powder bed material is as follows:

a. D50 is from about 45 µm to about 70 µm, b. D10 is from about 20 µm to about 50 µm, and c. D90 is from about 75 µm to about 100 µm.

In certain examples, the particles of the powder bed material can have a variety of shapes, such as substantially spherical particles or irregularly-shaped particles. In some examples, the particles can be capable of being formed into 3D printed parts with a resolution of about 10 to about 120 µm, for example about 20 to about 100 µm or about 20 to about 80 µm. As used herein, "resolution" refers to the size of the smallest feature that can be formed on a 3D printed part. The particles can form layers from about 10 to about 120 µm or 100 µm thick, allowing the fused layers of the printed part to have roughly the same thickness. This can provide a resolution in the z-axis direction of about 10 to about 100 µm. The particles can also have a sufficiently small particle size and sufficiently regular particle shape to provide about 10 to about 100 µm resolution along the x-axis and y-axis.

In some examples, the powder bed material comprises a polymer powder, for instance, a thermoplastic polymer powder. The polymer can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be a polyamide. Suitable polyamides include PA-6, PA-9, PA-11, PA-12, PA-66 and PA-612. Other suitable polymer powders include polyethylene powder, wax, thermoplastic polyurethane powder, acrylonitrile, butadiene styrene powder, amorphous polyamide powder, polymethylmethacrylate powder, ethylene-vinyl acetate powder, polyacrylate powder, silicone rubber, polypropylene powder, polyester powder, polycarbonate powder, copolymers of polycarbonate with acrylonitrile butadiene styrene, copolymers of polycarbonate with polyethylene terephthalate polyether ketone powder, polyacrylate powder, polystyrene powder, or mixtures thereof. In an example, the polymer powder can be a polyamide powder, e.g. PA-11 or PA-12. In another example, the polymer powder can be thermoplastic polyurethane.

In some examples, the polymer powder can include a polymer having amino groups. Such amino groups can crosslink with epoxy groups present, for example, if an epoxy-containing modifying agent or epoxy-containing further modifying agent is employed. This crosslinking can result in an increase in stiffness compared to the polymer in un-crosslinked form.

An example of a polymer having amino groups is polyamide. Suitable polyamides include PA-6, PA-9, PA-11, PA-12, PA-66, and PA-612. In some examples, polymers that include multiple amino groups can include from about 2 to about 1,000 amino groups per molecule.

The powder bed material may also include an anti-oxidant. The anti-oxidant can be sterically hindered phenol derivatives. The anti-oxidant can, for example be in the form of fine particles, e.g., 5 µm or less, that are e.g. dry blended with the remaining particles of the powder bed material. The anti-oxidant may be present at a concentration of at least about 0.01 wt %, for example, at least about 0.05 wt %, at least about 0.1 wt % or at least about 0.2 wt %. The anti-oxidant may be present at a concentration of at most about 2 wt %, for example, at most about 1.5 wt % or at most about 1 wt %. In some examples, the anti-oxidant may be present in an amount of e.g., from about 0.01 wt % to about 2 wt % or from about 0.2 wt % to about 1 wt % of the powder bed material.

The powder bed material can, in some cases, also comprise a filler. The filler can include inorganic particles such as alumina, silica, glass, and/or other similar fillers. In some examples, the filler can include a free-flow filler, anti-caking filler, or the like. Such fillers can prevent packing of the powder bed material, and/or coat the particles of the powder bed material and smooth edges to reduce inter-particle friction, and/or absorb moisture. In some examples, a weight ratio of thermoplastic polymer to filler particles in the powder bed material can be from about 99:1 to about 1:2, from about 10:1 to about 1:1, or from about 5:1 to about:1.

Example 1

In this example, a conductive trace precursor (CTP) compositions having the following composition was prepared:

| | CTP composition | | |
|---|---|---|---|
| Ingredient | I % w/w | II % w/w | Comparative % w/w |
| 2-pyrrolidone | 7.5 | 7.75 | |
| Alkyldiphenyloxide Disulfonate (Dowfax ™ 2A1 supplied by Dow ® Chemical) | 0.5 | | |
| Non-ionic fluorinated surfactant (Capstone FS-35 supplied by ChemPoint ®) | 0.025 | | |
| Cu(NO₃)₂•3H₂O | 40.0 | 40.0 | 40.0 |
| H₂O | Balance | Balance | Balance |

Each conductive trace precursor composition was applied to a glass substrate and heated from room temperature to at least 125 degrees C.

Figure 2:
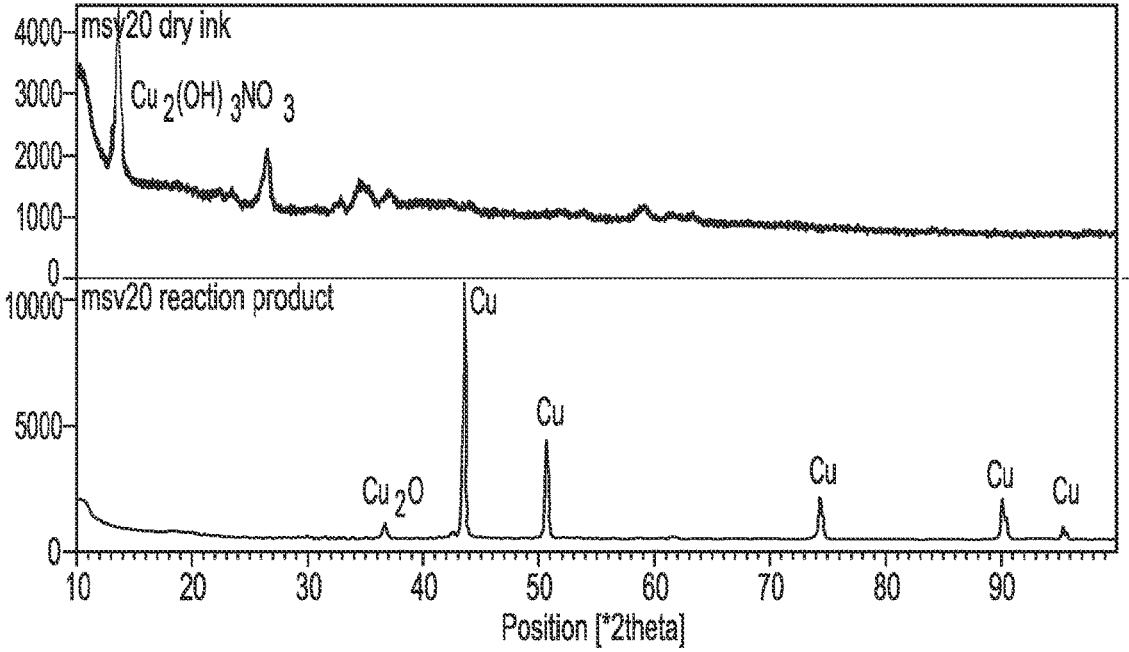
FIG. 2 shows the X-ray diffraction patterns of compositions I and II of Example 2 before and after reduction of the copper (II) salt.

With compositions I and II, an exothermic reaction occurred, causing the copper (II) ions in solution to be reduced to copper (0), leaving an elemental copper trace. An exotherm was observed when the reaction was analyzed by differential scanning calorimetry (DSC). See FIG. 1. The formation of copper was also confirmed by x-ray diffraction. As shown in FIG. 2, no copper (0) peaks were observed with the composition I prior to heating. However, after heating, copper (0) peaks were observed.

Example 2

In this Example, compositions consisting of 40.0 weight % Cu(NO₃)₂·3H₂O, water and 2-12 weight % of the reducing solvents shown in Table 1 below were prepared. The compositions were applied to a glass substrate and heated from room temperature to at least 125 degrees C. The heating process was analyzed by differential scanning calorimetry (DSC) to determine the presence or absence of an exotherm. The heated samples were examined for the presence of copper(0) (i.e. conductive trace) by visual inspection or x-ray diffraction. The results are shown in Table 1 below.

| Sample | Reducing Solvent (amount wt %) | Exotherm? | Conductive Trace? |
|---|---|---|---|
| A | Ethylene Glycol (12 wt %) | Yes | Yes |
| B | Propylene Glycol (12 wt %) | Yes | Yes |
| C | Glycerol (12 wt %) | Yes | Yes |
| D | Glycerol Ethoxylate (12 wt %) | Yes | Yes |
| E | Ethylhydroxypropanediol (12 wt %) | Yes | Yes |
| F | 1,2-butanediol (7.5 wt %) | Yes | Yes |
| G | Diethyleneglycol (12 wt %) | Yes | Yes |
| H | Dipropyleneglycol (7.5 wt %) | Yes | Yes |
| I | 2-pyrrolidinone (2, 4, 10 wt %) | Yes | Yes |
| J | 1-hydroxyethyl-2-pyrrolidinone (7.5 wt %) | Yes | Yes |
| K | Polyvinylpyrrolidone (7.5 wt %) | Yes | Yes |
| L | 1-pentanol (7.5 wt %) | No | No |
| M | 1-butanol (7.5 wt %) | No | No |

Definitions

It is noted that, as used in this specification and the appended claims, the singular forms "a" "an," and "the" include plural referents unless the content clearly dictates otherwise.

As used herein, the term "about" is used to provide flexibility to a range endpoint by providing that a given value may be "a little above" or "a little below" the endpoint. The degree of flexibility of this term can be dictated by the particular variable and can be determined based on experience and the associated description herein.

As used herein, a plurality of items, structural elements, compositional elements, and/or materials may be presented in a common list for convenience. However, these lists should be construed as though each individual member of the list is individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include the numerical values explicitly recited as the limits of the range, and also to include all the individual numerical values or sub-ranges encompassed within that range as if the numerical value and sub-range is recited. For example, a weight ratio range of about 1 wt % to about 20 wt % should be interpreted to include the explicitly recited limits of 1 wt % and about 20 wt %, and also to include individual weights such as 2 wt %, 11 wt %, 14 wt %, and sub-ranges such as 10 wt % to 20 wt %, 5 wt % to 15 wt %, etc.

As a further note, in the present disclosure, it is noted that when discussing the fluids, materials, and methods described herein, these discussions can be considered applicable to the various examples, whether or not they are explicitly discussed in the context of that example. Thus, for example, in discussing details about the methods of making 3D printed objects, such discussion also refers to the 3D printing kits, and vice versa.

Where selective jetting of an agent is performed based on a 3D object model, the 3D object model may comprise at least one of: a 3D object model created using Computer Aided Design (CAD) or similar software; or a file, for example, a Standard Tessellation Language file generated based on output of the CAD software, providing one or more processors of a 3D printer with instructions to form the 3D object

The invention claimed is:

1. A conductive trace precursor composition, consisting of:

copper nitrate;

water;

at least one surfactant present in an amount ranging from about 0.5 weight % to about 3 weight % of a total weight of the conductive trace precursor composition, the at least one surfactant including a non-ionic fluorinated surfactant; and a reducing solvent to reduce the copper nitrate to elemental copper in response to heat, wherein the reducing solvent is 2-pyrrolidone and is present in an amount ranging from 7.5 weight % to 7.75 weight % of the total weight of the conductive trace precursor composition.

2. The conductive trace precursor composition as defined in claim 1, wherein the copper nitrate is present in an amount ranging from about 5 weight % to about 70 weight % of the total weight of the conductive trace precursor composition.

3. The conductive trace precursor composition as defined in claim 1, wherein the copper nitrate is copper (II) nitrate and is present in an amount ranging from about 35 weight % to about 40 weight % of the total weight of the conductive trace precursor composition.

4. A method of printing a conductive trace onto a substrate, the method comprising:

applying the conductive trace precursor composition of claim 1 to a print substrate; and heating the conductive trace precursor composition to reduce the copper nitrate to the elemental copper.

5. The method as defined in claim 4, wherein the conductive trace precursor composition is heated to at least 125 degrees C. to reduce the copper nitrate to the elemental copper.

6. A method of 3D printing a 3D printed object having a conductive trace, the method comprising:

selectively applying a fusing agent to a powder bed material, wherein the fusing agent comprises a radiation absorber and a liquid carrier;

selectively applying the conductive trace precursor composition of claim 1 to the powder bed material;

reducing the copper nitrate to the elemental copper; and irradiating the selectively applied fusing agent to generate thermal energy to coalesce the powder bed material to form a layer of the 3D printed object.

7. The method as defined in claim 6, wherein the reducing of the copper nitrate occurs in the presence of the 2-pyrrolidinone.

8. The method as defined in claim 6, wherein the thermal energy generated during the irradiating facilitates the reducing of the copper nitrate to the elemental copper.

9. A 3D printed object including a conductive trace, the 3D printed object obtained by the method of claim 6.

10. A conductive trace precursor composition, consisting of:

from about 35 wt % to about 40 wt % of copper nitrate, based on a total weight of the conductive trace precursor composition;

from 7.5 wt % to 7.75 wt % of a reducing solvent, based on the total weight of the conductive trace precursor composition, to reduce the copper nitrate to elemental copper in response to heat, wherein the reducing solvent is 2-pyrrolidinone; and a balance of water.

* * * * *